United States Patent [19]
Sandhu et al.

[11] Patent Number: 5,196,739
[45] Date of Patent: Mar. 23, 1993

[54] HIGH VOLTAGE CHARGE PUMP

[75] Inventors: Bal S. Sandhu, Fremont; Frederick K. Leung, Cupertino, both of Calif.

[73] Assignee: National Semiconductor Corporation, Santa Clara, Calif.

[21] Appl. No.: 679,702

[22] Filed: Apr. 3, 1991

[51] Int. Cl.$^5$ ............................................. H03K 17/10
[52] U.S. Cl. .................................. 307/296.1; 307/296.2
[58] Field of Search ................ 307/296.1, 296.2, 296.8, 307/304

[56] References Cited

U.S. PATENT DOCUMENTS

| | | | |
|---|---|---|---|
| 4,701,637 | 10/1987 | Piro | 307/296.2 |
| 4,792,705 | 12/1988 | Ouyang et al. | 307/296.2 |
| 4,964,082 | 10/1990 | Sato et al. | 307/296.2 X |
| 5,039,877 | 8/1991 | Chern | 307/296.2 |

*Primary Examiner*—David Hudspeth
*Attorney, Agent, or Firm*—Townsend and Townsend

[57] ABSTRACT

A charge pump circuit for use in Electrically Erasable Programmed Read-Only Memories in described herein. The charge pump uses a single clock signal, a voltage feedback arrangement to allow a D.C. voltage to pass a D.C. voltage, and a plurality of transistors, each transistor being coupled in series with each grounded-gate transistor, eliminating reverse-breakdown voltage loads on the grounded gate transistors.

9 Claims, 3 Drawing Sheets

| TEMP DEG C | MAX V(7) VOLTS AC | MAX V(4) VOLTS AC | VPP1 V(6) VOLTS DC |
|---|---|---|---|
| −55 | 14.0 −16.8 | 14.9 −16.9 | 13.84 |
| 55 | 14.0 −16.8 | 15.0 −16.8 | 13.68 |
| 150 | 13.9 −16.5 | 15.0 −17.0 | 13.70 |

RESULTS FOR EXISTING CHARGE PUMP

FIG. 3

| TEMP DEG C | MAX V(7) VOLTS AC | MAX V(4) VOLTS DC | MAX V(8) VOLTS DC | VPP1 V(6) VOLTS DC |
|---|---|---|---|---|
| −55 | 13.8 −17.5 | 15.90 | 6.4 | 13.92 |
| 55 | 14.0 −17.8 | 17.00 | 7.5 | 14.00 |
| 150 | 13.7 −17.5 | 15.75 | 10.7 | 13.90 |

RESULTS FOR THE PRESENT INVENTION

VEDIT = 14V, VCC = 4.0V TEMP = −55 DEG TO 150 DEG
AND LEFF* = LEFF + 0.2UM
NOTE: V(8) IS THE MAX VOLTAGE SEEN BY A
GROUNDED GATE TRANSISTOR.

FIG. 4

HIGH VOLTAGE CHARGE PUMP

BACKGROUND OF THE INVENTION

The present invention relates to electrically erasable programmable read-only memories (EEPROMs). In particular, it relates to circuits used to provide the voltage levels necessary to program EEPROMs.

The circuits used to provide the necessary voltage signal to program an EEPROM are called charge pumps. Such circuits are known.

A known charge pump 10 is shown in FIG. 1. The purpose of the circuit is to pass whatever voltage appears on external pin $V_{ppin}$ to $V_{ppl}$, an internal node which is coupled to the memory cell being programmed. Ideally, there should be no voltage loss between $V_{ppin}$ and $V_{ppl}$.

When the EEPROM is being programmed, $\overline{STR}$ goes low. The gates of transistors 11, 13 and 33 all receive this signal, turning the transistors off. Simultaneously, $\overline{STR}$ is applied to inverter 25, the resultant signal being applied to the gate of transistor 27. Transistor 27 turns on, applying a voltage of $V_{cc} - V_t$ ($V_t$ is the voltage drop across a given transistor) to node 4.

The clock signal CLK now goes to a high voltage level. Assuming that the binary logic signals correspond to voltage levels of 0 volts for a logic 0, and 5 volts for a binary logic 1, node 4 now reaches approximately $V_{cc} - V_t + V_{clk} * X$ volts, where $V_{clk}$ is the clock amplitude swing and X is the capacitive divider ratio calculated as $X = C_D/C_D + C_S$, where $C_D$ is the value of the pump capacitor(s) 21 and 23 and $C_S$ is the total junction capacitance on node 4, or roughly 9 volts, assuming $V_{cc}$ is 5 volts. As CLK is high, $\overline{CLK}$ is low. At this point, transistors 17, 19 and 29 are all on, as their gates receive a high voltage from node 4. As transistor 15's gate and drain are coupled to $\overline{CLK}$, transistor 15 turns off. With transistor 17 conducting, node 6 climbs in voltage to $V_4 - V_T$, also charging capacitor 23. Node 6 will be limited to some fraction of $V_{ppin}$, about 7-8 volts. Node 8 rises to $V_4 - V_T$ where $V_4$ is the voltage on node 4.

When CLK goes low and $\overline{CLK}$ goes high, transistor 15 turns on, the voltage on node 6 rises, and the voltage on node 4 begins to drop. However, the charge on capacitor 21 is supported by the current through transistor 15 as the voltage on node 6 rises due to $\overline{CLK}$ going high, and the voltage on node 4 only drops to about 12 volts. When the CLK and $\overline{CLK}$ signals again reverse themselves, the voltage on node 4 climbs again. As transistor 19 turns on again, the voltage on node 8 also climbs.

After about a microsecond, the circuit stabilizes with node 4 varying in voltage between 15 and 17 volts. Ideally, the voltage on node 4 coupled to the gates of transistors 29 and 19 should pass the $V_{ppin}$ voltage from node 2 to node 12.

The type of charge pump just described has several deficiencies. Transistors 11, 13 and 33 each have their gates grounded during programming. This limits the total voltage which can be applied to their drain without causing reverse breakdown of the transistor. Additionally, even if breakdown does not occur, leakage currents to ground can result, causing a loss of voltage to $V_{ppl}$. As shown in FIG. 1, a maximum of roughly 16.5 volts can be applied to the drain of transistors 11 and 13 before the breakdown occurs. In turn, this requirement limits the maximum voltage that can be applied to the gate of transistor 29.

Node 4, after the circuit reaches equilibrium, alternates between 15 and 17 volts, establishing an A.C. voltage. This A.C. voltage is used to pass the D.C. voltage on node 2 to $V_{ppl}$. This results in some A.C. coupling between node 4 and node 8 and node 4 and node 12 as $V_{ppl}$ approaches $V_{ppin}$. The coupling again reduces the amount of charge that can be passed to $V_{ppl}$.

The charge pump also uses two separate clock signals, CLK and $\overline{CLK}$. Any time the two clocks become skewed with regards to one another, the efficiency of the charge pump decreases, as node 4 discharges to a lower level than optimum.

A charge pump without these noted deficiencies is clearly desirable.

SUMMARY OF THE INVENTION

The present invention, in one embodiment, comprises a charge pump for providing the charge necessary to program an EEPROM. The present invention puts depletion transistors with their gates connected to $V_{cc}$ in series with any transistor that may have a grounded gate. This increases the breakdown voltage (drain to source) from 16.5 v to 22 v for the grounded gate transistor and permits a much higher gate voltage to pass the programming voltage.

The present invention also uses a D.C. voltage to pass the programming voltage, which allows for better internal control of the programming voltage and avoids the A.C. coupling of the known charge pump. Additionally, as only one clock signal is used, clock skew and the problems related thereto are eliminated.

BRIEF DESCRIPTION OF THE DRAWINGS

FIGS. 3-4 are tables comparing the performance of the known charge pump and the present invention.

DESCRIPTION OF THE SPECIFIC EMBODIMENT(S)

Figure 1:
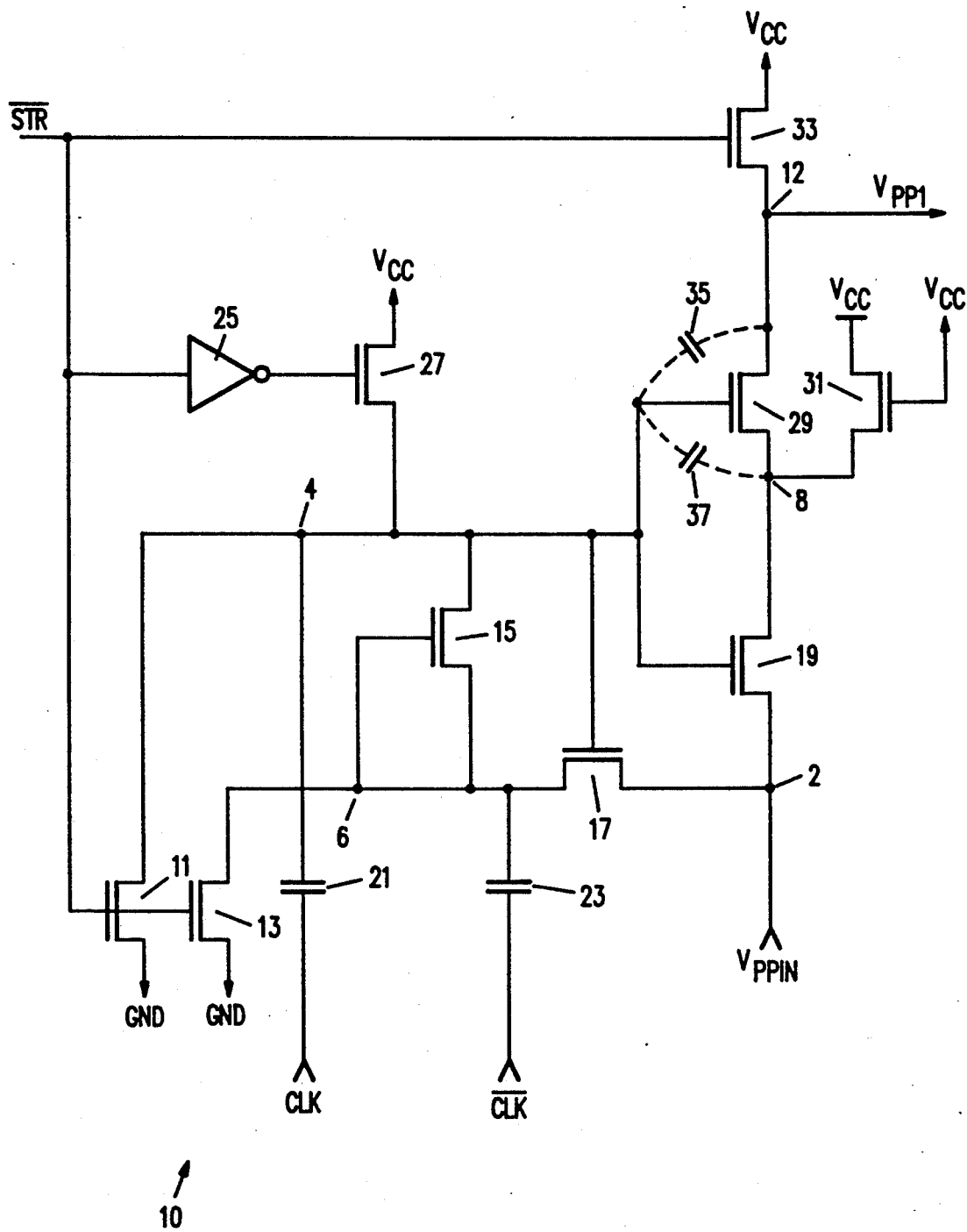
FIG. 1 is a circuit diagram of a known charge pump.
Figure 2:
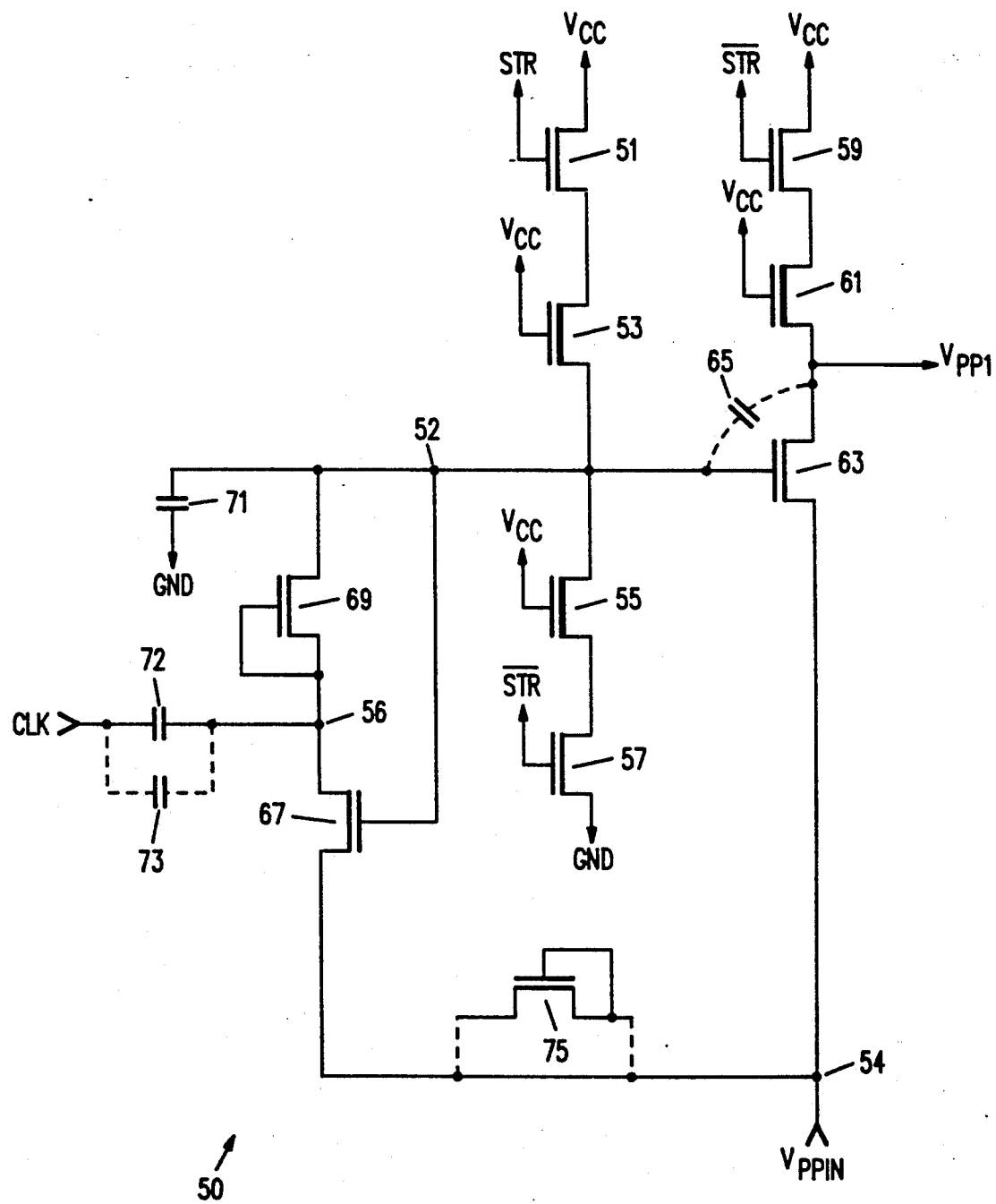
FIG. 2 is a circuit diagram of the present invention.

FIG. 2 illustrates a preferred embodiment of the present invention.

During programming of the EEPROM, STR goes high and $\overline{STR}$ goes low. Transistors 59 and 57 turn off and transistor 51 turns on. As the gates of 53, 61, and 55 are coupled to $V_{cc}$, these transistors are always on. Thus, once STR goes high, node 52 charges up to $V_{cc} - V_T$. When $\overline{STR}$ is high, the pump is not used for programming, and the charge on node 52 is drained through transistors 55 and 57 to ground, which in turn shuts off transistor 63.

Given that STR is high and $\overline{STR}$ is low, the first high CLK pulse begins the charging process. When CLK goes high, transistor 69, which functions as a forward biased diode, turns on. Node 52, which was at $V_{cc} - V_T$, now rises to $V_{cc} - 2 V_T + V_{clk} * x$, where x is the same capacitive ratio previously defined. This voltage feeds back to transistor 67, turning it on, and thereby still further increasing the voltage on node 56 and 52.

When CLK goes low, capacitor 71 maintains the voltage on node 52. Transistor 69 becomes reversed biased when the clock goes from high to low. This isolates the voltage on node 52.

Successive clock pulses result in node 52 reaching and holding a voltage between 15 and 17 volts, depending on the temperature and $V_{cc}$. That voltage, in contrast to the known art, is a DC voltage, as no capacitor discharges the voltage on node 52 to ground. In addition, the increase in voltage on node 52 occurs in a much more linear fashion than the known art.

As shown in FIG. 2, each transistor having a grounded gate (transistors 51, 57 and 59) is coupled in series with a depletion transistor with its gate coupled to $V_{cc}$. This effectively increases the breakdown voltage from drain to source from 16.5 volts to 22 volts for transistors with grounded gates, eliminating the need for 'edgeless' transistors and allowing a higher gate voltage to pass the programming voltage.

By using a D.C. voltage to pass the programming voltage, better control of the voltage on $V_{ppl}$ is obtained. Also, by using, only one clock, clock skew is irrelevant.

FIGS. 3-4 are tables comparing the performance of the present invention with the known charge pump. Note that the maximum voltage on a grounded gate transistor in the present invention is 10.7 volts, compared with at least 15 volts in known pumps.

Several modifications to the present invention are possible. By coupling transistor 75 into the circuit, another voltage drop $V_T$ can be obtained between nodes 54 and 56. Also, a second clock coupling capacitor 73 could be fabricated, improving the pump's efficiency. As many such additions and modifications may be made to the preferred embodiment without deviating from the teachings of the present invention, the invention should not be construed in connection with any one embodiment, but rather defined by the broad scope and breadth of the claims.

What is claimed is:

1. A charge pump circuit, the circuit receiving a D.C. charge signal, a programming signal, a complement programming signal and a clock signal, the circuit producing a D.C. charging signal and comprising:

a first and second transistor coupled drain to source, the source of the first transistor being coupled to a D.C. power source, the gate of the first transistor being coupled to the programming signal, the gate of the second transistor being coupled to the d.c. power source and the drain of the second transistor being coupled to a first node;

a voltage feedback circuit comprising first and second capacitors and third and fourth transistors, the first capacitor being coupled to a ground and the first node, the drain of the third transistor being coupled to the first node, the second capacitor being coupled to the clock signal and the gate and source of the third transistor and the drain of the fourth transistor, the gate of the fourth transistor being coupled to the first node and the source of the fourth transistor being coupled to the D.C. charge signal;

a fifth and sixth transistor, coupled drain to source, the source of the fifth transistor being coupled to the ground, the gate of the fifth transistor being coupled to the compliment programming signal, the gate of the sixth transistor being coupled to the D.C. power source and the drain of the sixth transistor being coupled to the first node; and seventh, eighth, and ninth transistors, coupled in series drain to source, the gate of ninth transistor being coupled to the first node, the drain of the ninth transistor being coupled to the D.C. charge signal the gate of the eighth transistor being coupled to the D.C. power source, the gate of the seventh transistor being coupled to the compliment programming signal and the source of the seventh transistor being coupled to the D.C. power source, the D.C. charging signal appearing on the connection between the drain of the eighth transistor and the source of the ninth transistor.

2. A circuit for transferring a first voltage at a first input node to a first output node comprising:

first switch means for coupling a second voltage to a second node in response to a first signal;

second switch means for coupling the second node to a ground voltage in response to an inverse of the first signal;

third switch means for coupling a clock voltage to the second node when a clock signal is present, a capacitor maintaining most of the clock voltage on the second node when the clock signal is not present;

fourth switch means for coupling the first output node to the second voltage in response to the inverse of the first signal; and fifth switch means for coupling the first input node and the first voltage thereon to the first output node in response to the first signal and the voltage on the second node.

3. A method for transferring a first voltage on a first input node to a first output node, the method comprising the steps of:

switching a second voltage to a second node in response to a first signal;

switching the second node to a ground voltage in response to an inverse of the first signal;

switching a clock voltage to the second node when a clock signal is present and maintaining the clock voltage on the second node when the clock signal is not present;

switching the first output node to the second voltage in response to the inverse of the first signal; and switching the first voltage on the first input node to the first output node in response to the first signal and the voltage on the second node.

4. A circuit for transferring a first voltage at a first input node to a first output node comprising:

first switch means for coupling a second voltage to a second node in response to a first signal;

second switch means for coupling the second node to a ground voltage in response to an inverse of the first signal;

third switch means for coupling a clock voltage to the second node when a clock signal is present, a capacitor maintaining most of the clock voltage on the second node when the clock signal is not present;

fourth switch means for coupling the first output node to the second voltage in response to the inverse of the first signal; and fifth switch means for coupling the first input node and the first voltage thereon to the first output node in response to the first signal and the voltage on the second node, wherein the first switch means comprises a first transistor and a second transistor, a source of the first transistor being coupled to the second voltage, a gate of the first transistor being coupled to the first signal, the drain of the first transistor being coupled to a source of the second transistor, a gate of the second transistor being coupled to the second voltage, and a drain of the second transistor being coupled to the second node.

5. The circuit of claim 4 wherein the second switch means comprises a third transistor and a fourth transistor, a source of the third transistor being coupled to the second node, a gate of the third transistor being coupled to the second voltage, a drain of the third transistor being coupled to a source of the fourth transistor, a gate of the fourth transistor being coupled to the inverse of the first signal, and a drain of the fourth transistor being coupled to a ground voltage.

6. The circuit of claim 5 wherein the third switch means comprises a first capacitor coupled to the clock signal and a third node, a diode means coupled to the third node and second node, a second capacitor coupled to the ground voltage and the second node, and a fifth transistor, a gate of the fifth transistor being coupled to the second node, a drain of the fifth transistor being coupled to the third node, and a source of the fifth transistor being coupled to the first input node.

7. The circuit of claim 6 wherein the fourth switch means comprises a sixth and seventh transistor, a source of the sixth transistor being coupled to the second voltage, a gate of the sixth transistor being coupled to the inverse of the first signal, a drain of the sixth transistor being coupled to a source of the seventh transistor, a gate of the seventh transistor being coupled to the second voltage, and a drain of the seventh transistor being coupled to the first output node.

8. The circuit of claim 7 wherein the fifth switch means comprises an eighth transistor, a source of the eighth transistor being coupled to the first output node, a gate of the eighth transistor being coupled to the second node, and a drain of the eighth transistor being coupled to the first input node.

9. The circuit of claim 6 wherein the diode means comprises a ninth transistor, a gate and a source of the ninth transistor being coupled to the third node and a drain of the ninth transistor being coupled to the second node.

* * * * *